(12) United States Patent
Aoki

(10) Patent No.: US 7,982,317 B2
(45) Date of Patent: Jul. 19, 2011

(54) SEMICONDUCTOR DEVICE, SEMICONDUCTOR DEVICE MODULE, AND METHOD FOR MANUFACTURING THE SEMICONDUCTOR DEVICE MODULE

(75) Inventor: Dai Aoki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 235 days.

(21) Appl. No.: 12/471,449

(22) Filed: May 25, 2009

(65) Prior Publication Data
US 2009/0289374 A1 Nov. 26, 2009

(30) Foreign Application Priority Data

May 23, 2008 (JP) ................. 2008-135786

(51) Int. Cl.
*H01L 23/48* (2006.01)

(52) U.S. Cl. ............... 257/773; 438/108; 257/E21.499; 257/E23.142

(58) Field of Classification Search .............. 257/676, 257/690, 692, 735, 773, E21.499, E23.142; 438/108
See application file for complete search history.

(56) References Cited

U.S. PATENT DOCUMENTS 7,009,282 B2 * 3/2006 Golick .................... 257/666
2006/0171135 A1 8/2006 Ishizaka et al.

FOREIGN PATENT DOCUMENTS

| JP | 2006-222412 A | 8/2006 |
| JP | 2006-339540 A | 12/2006 |
| JP | 2006-339541 A | 12/2006 |

* cited by examiner

Primary Examiner — Quoc D Hoang
(74) Attorney, Agent, or Firm — Kenealy Vaidya LLP

(57) ABSTRACT

A semiconductor device can include a plurality of semiconductor elements. The characteristics of each of the semiconductor elements can be easily tested during the production of the semiconductor device or when a failure occurs after the semiconductor device is mounted on a substrate, so that the quality can be well managed and a failure can be reliably analyzed. When not mounted on the substrate, the semiconductor device can have a connection structure in which the plurality of semiconductor elements are electrically independent of each other, so that their characteristics can be tested and analyzed by independently energizing the semiconductor elements. In a semiconductor device module having the semiconductor device mounted thereon, the connection structure can include a parallel circuit of the plurality of semiconductor elements. Therefore, all the semiconductor elements can be driven by applying a voltage between a pair of solder-bonding electrode pads disposed on the semiconductor device-mounting substrate.

20 Claims, 7 Drawing Sheets

SEMICONDUCTOR DEVICE, SEMICONDUCTOR DEVICE MODULE, AND METHOD FOR MANUFACTURING THE SEMICONDUCTOR DEVICE MODULE

This application claims the priority benefit under 35 U.S.C. §119 of Japanese Patent Application No. 2008-135786 filed on May 23, 2008, which is hereby incorporated in its entirety by reference.

BACKGROUND

1. Technical Field

The presently disclosed subject matter relates to a semiconductor device having a plurality of semiconductor elements mounted thereon, to a semiconductor device module having such a semiconductor device mounted thereon, and to a method for manufacturing such a semiconductor device module.

2. Description of the Related Art

Semiconductor devices (such as semiconductor light emitting devices) including a plurality of semiconductor elements (such as semiconductor light emitting elements) that serve as light sources are used in various fields and applications such as light sources for backlights of LCD display devices, light sources for vehicle interior illumination devices, light sources for outdoor illumination devices, and light sources for flash lamps. Accordingly, the performance specifications of such semiconductor devices can vary for different applications.

If such light emitting devices have high brightness, semiconductor devices can be configured such that the luminous or radiant flux of light emitted from each of the semiconductor light emitting elements is increased, or such that the number of the semiconductor light emitting elements constituting the light emitting device is increased to increase the luminous flux of light emitted from the light emitting device.

The former case can be achieved by increasing the size of each semiconductor light emitting element to increase the area of the light emitting surface (or to increase the flux of the semiconductor light emitting element). However, the increase in the size of the semiconductor light emitting element can cause the following problems:

(1) The probability that crystal defects such as dislocations are present can be high, and therefore the characteristics in a small-current region and the reverse characteristics are likely to deteriorate;

(2) The number of semiconductor light emitting elements that can be obtained from one wafer can be low, and the manufacturing yield, or the number of usable elements, can be low, so that the manufacturing cost can increase; and (3) The linearity can deteriorate due to the potential distribution in the junction plane caused by the layer resistance.

To solve these problems, a plurality of semiconductor light emitting elements of ordinary size can be used to increase the luminous intensity of the light emitting device, although the manufacturing cost including the material cost and assembling cost can increase.

In such a case, the plurality of semiconductor light emitting elements are electrically connected, for example, in series or parallel. When the semiconductor light emitting elements are connected in series, the same current can flow through each of the semiconductor light emitting elements irrespective of variations in the current-voltage characteristic of the elements, so that the variations in the luminous or radiant flux of the elements can be suppressed. However, problems of series connection can be when a high voltage power source is used, a high driving voltage occurs and that if even one of the semiconductor light emitting elements is broken, then all the elements do not illuminate.

When the semiconductor light emitting elements are connected in parallel, the driving voltage can be low, and therefore the elements can be driven by a low-voltage power source. In addition, even when one of the semiconductor light emitting elements is broken and does not illuminate, the rest of the elements can be illuminated. However, a problem of parallel connection can be that the values of the currents flowing through the semiconductor light emitting elements are different due to variations in their current-voltage characteristics. This can cause variations in the luminous or radiant flux of the semiconductor light emitting elements and variations in luminous or radiant flux reduction ratio.

As described above, each of the series and parallel connections of semiconductor light emitting elements has advantages and disadvantages. Generally, in many cases, semiconductor light emitting devices are used together with other electronic components such as transistors and ICs and driven by general-purpose simple power sources such as dry batteries. Therefore, a parallel connection, in which a low-voltage power source can be used, is often employed.

When semiconductor light emitting elements are connected in parallel, the problem associated with the parallel connection must or should be solved. To solve the problem, the following methods have been proposed.

In one method, semiconductor light emitting elements to be connected in parallel are selected in advance such that their forward voltages match each other (see, for example, Japanese Patent Application Laid-Open No. 2006-222412 corresponding to US 2006/0171135A1). In this manner, the variations in the forward voltages of the semiconductor light emitting elements are reduced to render the forward currents flowing through the elements uniform, so that the variations in luminous flux and variations in luminous flux reduction ratio are reduced.

In another method, semiconductor light emitting elements are die-bonded with die-bonding paste having a resistive component (see, for example, Japanese Patent Application Laid-Open No. 2006-339541). The die-bonding paste provides a series resistance according to the forward voltage of each semiconductor light emitting element, so that the current imbalance between the elements is reduced.

In another method, semiconductor light emitting elements are wire-bonded with bonding wires having a certain resistance (see, for example, Japanese Patent Application Laid-Open No. 2006-339540). In this manner, the gradient of voltage-current characteristics of the semiconductor light emitting elements is reduced to decrease the current imbalance between the elements.

SUMMARY

During production, semiconductor light emitting devices can be tested for electrical characteristics such as forward and reverse current-voltage characteristics and optical characteristics such as luminous intensity and luminous flux. Only the semiconductor light emitting devices that fulfill the specifications are supplied to the market, and, if appropriate, the quality information can be provided to individual users.

In the test process, characteristics can be tested in an energized state by applying a voltage to the semiconductor light emitting elements through external electrodes connected to the electrodes of the elements and extending outside the semiconductor light emitting device.

However, when a plurality of semiconductor light emitting elements are mounted on a semiconductor light emitting device and connected in parallel in the device, each of a pair of external electrodes extending outside the device is connected to the anodes or cathodes of the elements. Therefore, when a voltage is applied to the external electrodes, all the semiconductor light emitting elements can be energized.

Accordingly, it is difficult to test the electrical and optical characteristics of individual semiconductor light emitting elements constituting the semiconductor light emitting device. Therefore, the manufacturer may not be able to obtain the detailed characteristics of the semiconductor light emitting device, and it can be difficult to provide detailed information to users.

Moreover, when failures occur in some of the semiconductor light emitting elements constituting a semiconductor light emitting device, it can be difficult to analyze the failures of the faulty elements and to take measures based on the analysis results.

Examples of the failures can include: no light emission in a small-current region; and a reduction in element life caused by an overcurrent due to variations in dynamic resistance of semiconductor light emitting elements when a large current is applied.

The presently disclosed subject matter was devised in view of these and other problems and in association with the conventional art. According to an aspect of the presently disclosed subject matter, a semiconductor device can be provided in which the electrical and optical characteristics of individual semiconductor elements constituting the device can be easily tested during production. According to still another aspect of the presently disclosed subject matter, a semiconductor device module can be provided in which, when a failure occurs in the semiconductor device mounted on the module, the failure of the faulty semiconductor element can be easily analyzed and measures can be taken easily based on the analysis results. According to still another aspect of the presently disclosed subject matter, there is provided a method for manufacturing such a semiconductor device module.

To solve and/or address at least the above problems and characteristics, a first aspect of the presently disclosed subject matter includes providing a semiconductor device that can include: a substrate; a plurality of semiconductor elements mounted on the substrate and each can include a first potential applied electrode and a second potential applied electrode; a first wiring pattern formed on the substrate and electrically connected to the first potential applied electrodes of the plurality of semiconductor elements; and a second wiring pattern formed on the substrate and electrically connected to the second potential applied electrodes of the plurality of semiconductor elements. The semiconductor device can be configured to be mounted on a semiconductor device-mounting substrate with the plurality of semiconductor elements connected in parallel to constitute a semiconductor device module, the first wiring pattern can include a wiring trace group including a plurality of electrically independent wiring traces connected to the first potential applied electrodes of the plurality of semiconductor elements, and the wiring trace group can include a bonding area that serves as a bonding portion to be bonded to the semiconductor device-mounting substrate, the electrically independent wiring traces can be electrically connected to each other in the bonding area after the semiconductor device is mounted on the semiconductor device-mounting substrate.

A second aspect of the presently disclosed subject matter includes providing the semiconductor device according to the first aspect, wherein the semiconductor device is mounted on the semiconductor device-mounting substrate with a solder material.

A third aspect of the presently disclosed subject matter includes providing the semiconductor device according to the second aspect, wherein, in the bonding area, a spacing between adjacent ones of the electrically independent wiring traces can be smaller than a spread width of the solder material spread during bonding.

A fourth aspect of the presently disclosed subject matter includes providing the semiconductor device according to the second or third aspect, wherein, in the bonding area, a spacing between adjacent ones of the electrically independent wiring traces can be 0.1 mm or less.

A fifth aspect of the presently disclosed subject matter includes providing the semiconductor device according to any one of the first to fourth aspects, wherein at least adjacent two of the electrically independent wiring traces each can have protruding portions, the protruding portions of each one of the at least adjacent two of the electrically independent wiring traces can be formed to protrude toward the other one of the at least adjacent two of the electrically independent wiring traces, the protruding portions can be disposed in a staggered manner.

A sixth aspect of the presently disclosed subject matter includes a semiconductor device module that can include: a semiconductor device-mounting substrate that can include a circuit pattern formed thereon; and a semiconductor device mounted on the semiconductor device-mounting substrate, the semiconductor device can include a substrate, a plurality of semiconductor elements mounted on the substrate and each including a first potential applied electrode and a second potential applied electrode, a first wiring pattern formed on the substrate and electrically connected to the first potential applied electrodes of the plurality of semiconductor elements, and a second wiring pattern formed on the substrate and electrically connected to the second potential applied electrodes of the plurality of semiconductor elements, wherein the first wiring pattern can include a wiring trace group that can include a plurality of separate wiring traces connected to the first potential applied electrodes of the plurality of semiconductor elements, and the wiring trace group can include a bonding area bonded to the semiconductor device-mounting substrate, the separate wiring traces of the first wiring pattern being electrically connected to each other in the bonding area, whereby the plurality of semiconductor elements can be connected in parallel.

A seventh aspect of the presently disclosed subject matter includes a method for manufacturing a semiconductor device module which can include a semiconductor device-mounting substrate and a semiconductor device mounted on the semiconductor device-mounting substrate, the semiconductor device-mounting substrate can include a circuit pattern formed thereon, the semiconductor device can include a substrate, a plurality of semiconductor elements mounted on the substrate and each can include a first potential applied electrode and a second potential applied electrode, a first wiring pattern formed on the substrate and electrically connected to the first potential applied electrodes of the plurality of semiconductor elements, and a second wiring pattern formed on the substrate and electrically connected to the second potential applied electrodes of the plurality of semiconductor elements, the method can include: preparing the semiconductor device in which the first wiring pattern can include a wiring trace group that can include a plurality of electrically independent wiring traces connected to the first potential applied electrodes of the plurality of semiconductor elements; applying a solder material to a predetermined position on the circuit pattern; and mounting the semiconductor device on the semiconductor device-mounting substrate such that the plurality of electrically independent wiring traces are electrically connected to each other in a part of the wiring trace group through the solder material.

The semiconductor device of the first aspect of the presently disclosed subject matter can include the first wiring pattern including a plurality of electrically independent wiring traces that are electrically connected to the first potential applied electrodes of the semiconductor elements such that the semiconductor elements can be independently driven.

The semiconductor device module can include the semiconductor device configured as above and solder-mounted on a semiconductor device-mounting substrate, and the semiconductor elements can be connected in parallel so that all the semiconductor elements can be simultaneously driven.

Accordingly, when the semiconductor device is not mounted on the semiconductor device-mounting substrate, the electrical and optical characteristics of the individual semiconductor elements of the semiconductor device can be easily tested. Therefore, the quality management during production can be easily performed. Moreover, when a failure occurs, measures can be easily taken based on failure analysis.

Since the test can be performed after the semiconductor elements are mounted on the substrate, not only the failure of the semiconductor elements themselves but also the electrical characteristics that tend to have variations after die-bonding or wire-bonding can be tested. Therefore, failures caused by die-bonding or wire-bonding can be found, and a high quality semiconductor device and a high quality semiconductor device module can be provided.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

Figure 1:
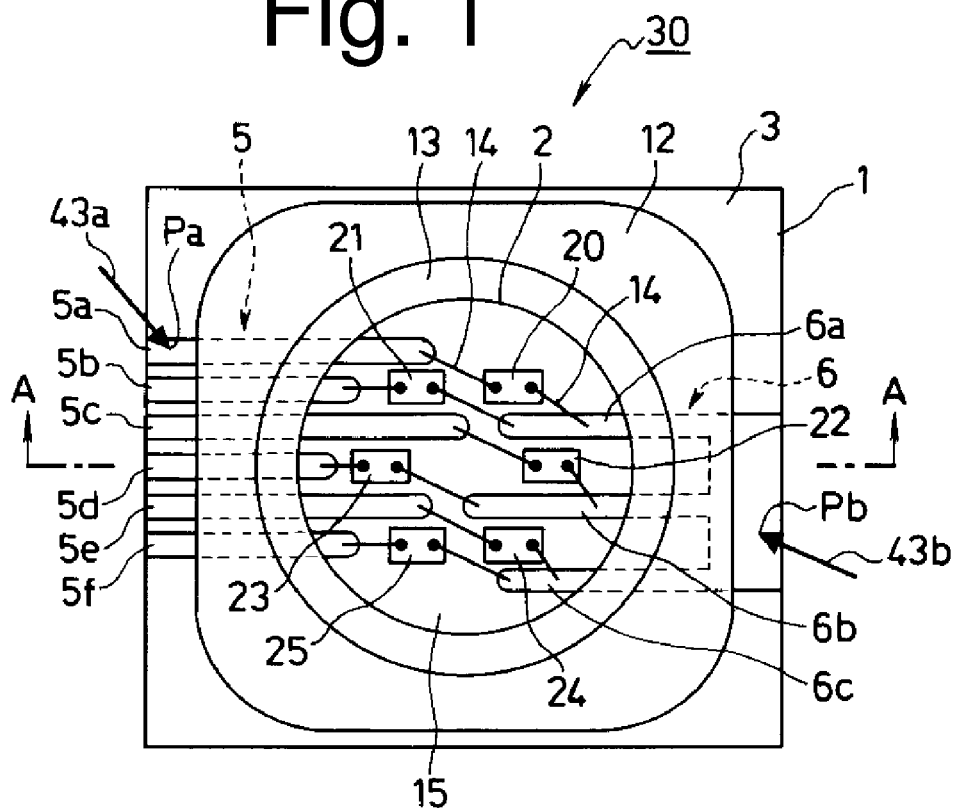
FIG. 1 is a top view of an exemplary embodiment made in accordance with principles of the presently disclosed subject matter.

A description will now be made below to semiconductor devices of the presently disclosed subject matter with reference to the accompanying drawings of FIGS. 1 to 13 in accordance with exemplary embodiments. Similar components are designated by the same numerals throughout the drawing figures. The exemplary embodiments described hereinafter are particular specific examples of the presently disclosed subject matter, and thus various particular technical features are associated therewith. However, the scope of the presently disclosed subject matter is not limited to the exemplary embodiments.

Figure 2:
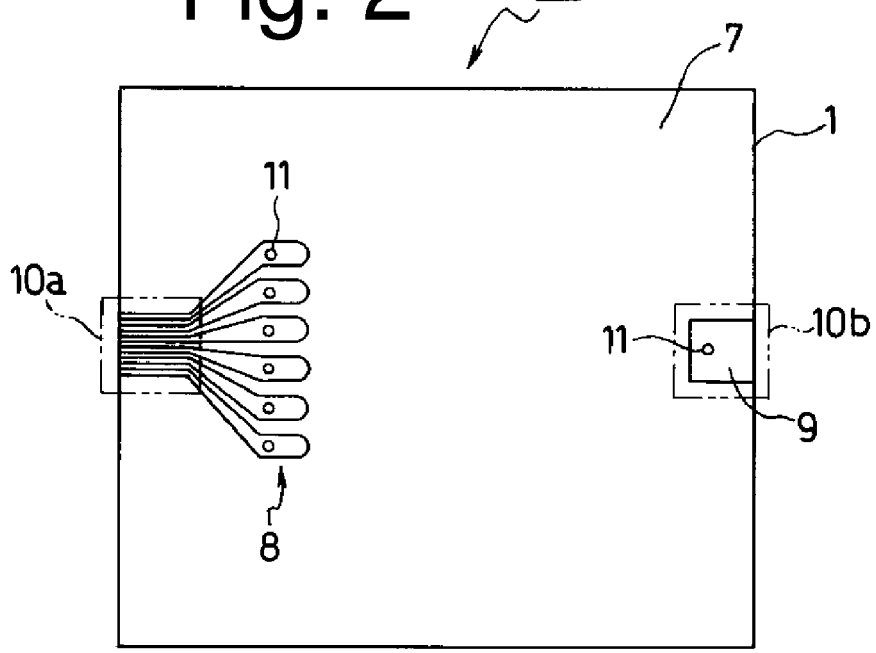
FIG. 2 is a bottom view of the exemplary embodiment of the presently disclosed subject matter.
Figure 3:
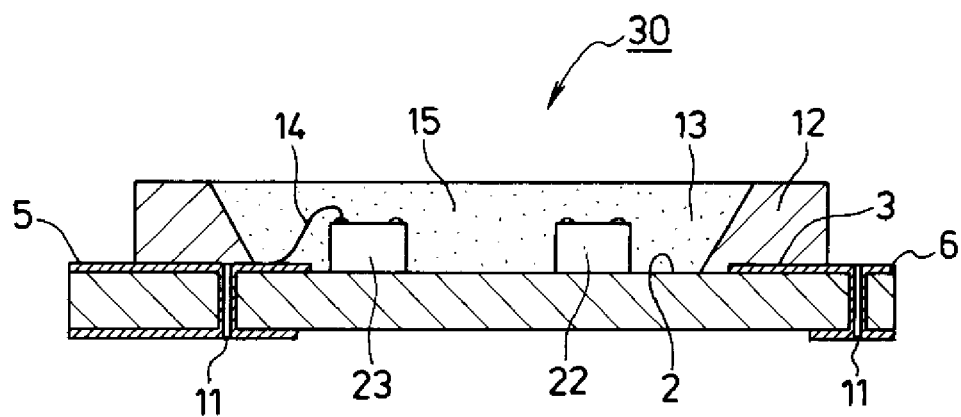
FIG. 3 is a cross-sectional view taken along line A-A in FIG. 1.
Figure 4:
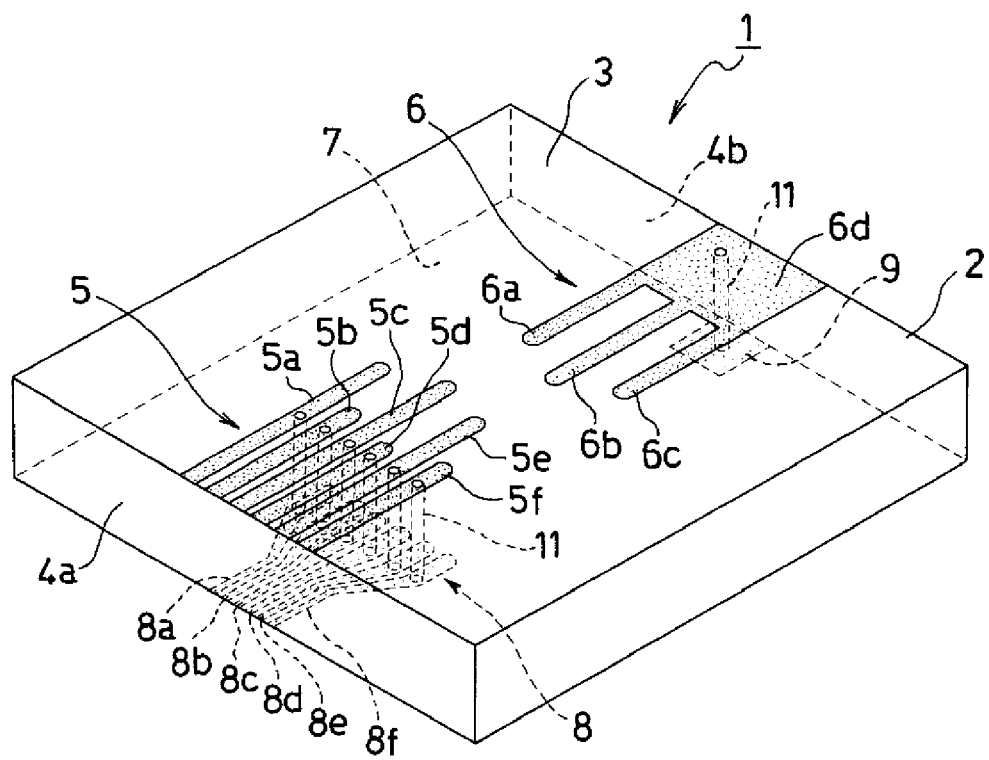
FIG. 4 is a perspective view of a schematic diagram of a substrate of a semiconductor device.

FIGS. 1 to 4 show an exemplary embodiment of a semiconductor device made in accordance with principles of the presently disclosed subject matter. FIG. 1 is a top view of the semiconductor device, FIG. 2 is a bottom view, FIG. 3 is a cross-sectional view taken along line A-A in FIG. 1, and FIG. 4 is a schematic diagram illustrating the wiring patterns of the substrate of the semiconductor device. In FIGS. 1 and 4, parts that are not directly visible are depicted by broken lines. The present exemplary embodiment can include: semiconductor elements; a substrate on which the semiconductor elements are mounted; a reflecting frame disposed on the substrate so as to surround the semiconductor elements mounted on the substrate; and a sealing resin disposed so as to cover the semiconductor elements surrounded by the reflecting frame.

With reference to FIG. 4, a description will first be given of the substrate. The substrate 1 can include a ceramic substrate used as an insulating substrate 2, and wiring patterns can be formed on both sides of the insulating substrate 2. Ag or an Ag alloy (such as Ag—Pt) can be used as the material for the wiring patterns, and the wiring patterns can be formed by printing or plating.

The insulating substrate 2 can include a plurality of sides including a semiconductor element-mounting side 3 and a pair of opposite sides 4a and 4b. The wiring patterns on the semiconductor element-mounting side 3 of the insulating substrate 2 can include a first wiring trace group 5 and a second wiring pattern 6 that extend from one of opposite sides 4a and 4b of the insulating substrate 2 toward the other of the opposite sides 4b and 4a.

The first wiring trace group 5 can include six electrically independent wiring traces 5a to 5f separated from each other. The second wiring pattern 6 can include three wiring traces 6a to 6c and an integrated portion 6d that is formed by integrating the wiring traces 6a to 6c at a position adjacent the side 4b.

As described above, the first wiring trace group 5 can be disposed on the semiconductor element-mounting side 3 of the substrate 1 and can include the independent wiring traces 5a to 5f. To ensure the connection with bonding wires (described later), the width of the independent wiring traces 5a to 5f can be at least 0.2 mm. When the characteristics of the individual semiconductor elements are tested, the position of the semiconductor device placed on a testing apparatus may be displaced. In consideration of the displacement and to ensure contact between the test probes and the wiring patterns, the spacing between each adjacent ones of the wiring traces 5a to 5f can be at least 0.1 mm.

The plurality of sides of the insulating substrate 2 can include a solder-bonding side 7 opposite to the semiconductor element-mounting side 3. The wiring patterns on the solder-bonding side 7 of the insulating substrate 2 can include a third wiring trace group 8 and a fourth wiring pattern 9. The third wiring trace group 8 and the fourth wiring pattern 9 can extend from one of the pair of opposite edges 4a and 4b, from which the first wiring trace group 5 and the second wiring pattern 6 extend, toward the other of the opposite edges 4b and 4a. More specifically, the third wiring trace group 8 can be formed on the side opposite to the first wiring trace group 5 with the insulating substrate 2 interposed therebetween, and the fourth wiring pattern 9 is formed on the side opposite to the second wiring pattern 6 with the insulating substrate 2 interposed therebetween.

Figure 5:
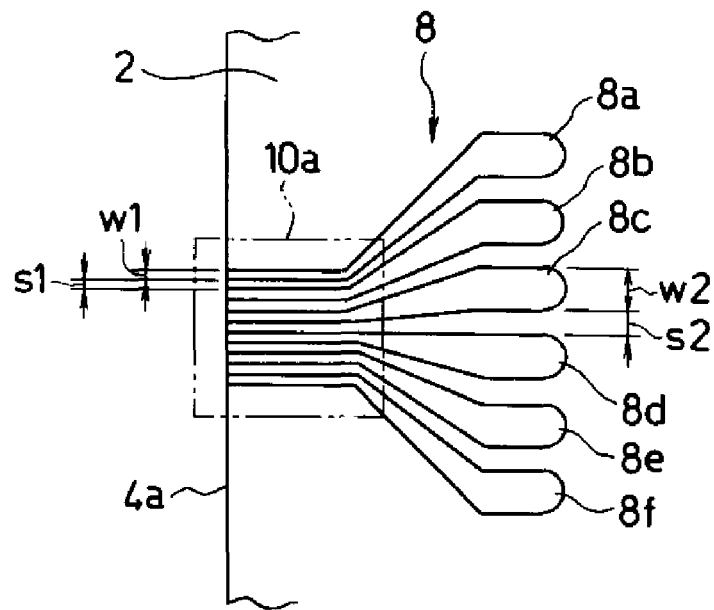
FIG. 5 is a partial enlarged view of a first surface of the substrate shown in FIG. 4.

Similar to the first wiring trace group 5, the third wiring trace group 8 can include six independent wiring traces 8a to 8f. Referring to FIG. 5, in a solder-bonding area 10a located adjacent the side 4a side of the insulating substrate 2, the width of the wiring traces 8a to 8f and the spacing between each adjacent pair of the wiring traces 8a to 8f can be smaller than those in the central portion. More specifically, in the solder-bonding area 10a, the trace width w1 can be at most 0.1 mm (0.1 mm or less), and the spacing s1 between adjacent traces can be at most 0.1 mm (0.1 mm or less). Similar to the first wiring trace group 5, in the central portion, the wiring pattern width w2 of the third wiring trace group 8 can be 0.2 mm or more, and the spacing between each adjacent wiring traces can be 0.1 mm or more (see FIG. 5). In an exemplary embodiment, to avoid an electrical short-circuit caused by migration before mounting of the semiconductor device, the wiring traces 5a to 5f and the wiring traces 8a to 8f can be formed such that the spacing between adjacent traces is 0.08 mm or more.

Figure 6:
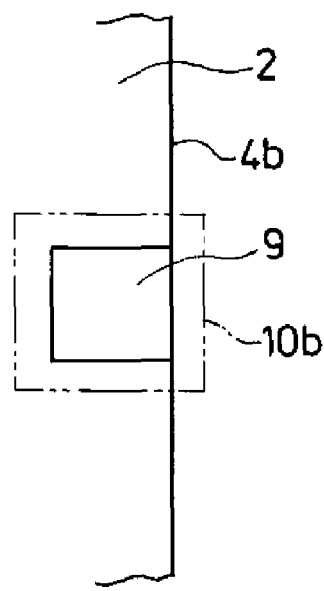
FIG. 6 is another partial enlarged view of the first surface of the substrate shown in FIG. 4.

With reference to FIG. 6, the fourth wiring pattern 9 extending from the side 4b of the insulating substrate 2 toward the opposite side 4a can be formed as a single wiring trace, and the entire fourth wiring pattern 9 can be located in a solder-bonding area 10b(.

Returning to FIG. 4, a description will be given of the connection relationship of the wiring patterns. As described above, the six independent wiring traces 8a to 8f of the third wiring trace group 8 can be formed so as to be located opposite to the six independent wiring traces 5a to 5f of the first wiring trace group 5 with the insulating substrate 2 interposed therebetween. The six independent wiring traces 5a to 5f can be electrically connected to the six independent wiring traces 8a to 8f via through-holes 11. In addition, the fourth wiring pattern 9 can be formed so as to be located opposite to the integrated portion 6d of the second wiring pattern 6 with the insulating substrate 2 interposed therebetween. The fourth wiring pattern 9 can be electrically connected to the integrated portion 6d via a through-hole 11.

Among the first wiring trace group 5, the second wiring pattern 6, the third wiring trace group 8, and the fourth wiring pattern 9, at least the third wiring trace group 8 and the fourth wiring pattern 9, which are disposed on the solder-bonding side 7 of the substrate 1 can have a thickness of 10 μm.

The characteristic test of each of the semiconductor elements can be performed from the semiconductor element-mounting side 3 of the substrate 1 and also from the solder-bonding side 7.

In the semiconductor device 30 shown in FIGS. 1 to 3, a reflecting frame 12 formed by pressing a ceramic powder can be disposed on the semiconductor element-mounting side 3 of the substrate 1. The insulating substrate 2, the end portions of the wiring traces 5a to 5f of the first wiring trace group 5, and the end portions of the wiring traces 6a to 6c of the second wiring pattern 6 can extend into the bottom of a recess 13 provided in the central portion of the reflecting frame 12.

Six semiconductor elements 20 to 25 can be placed on a portion of the insulating substrate 2 that extends along the bottom of the recess 13 of the reflecting frame 12. Each of the semiconductor elements 20 to 25 can include a pair of electrodes disposed on the upper portion thereof. Each pair of electrodes can include a first potential applied electrode and a second potential applied electrode. Each of the first potential applied electrodes can be connected, through a bonding wire 14, to a corresponding one of the wiring traces 5a to 5f of the first wiring trace group 5. Pairs of the second potential applied electrodes can be connected, through bonding wires 14, to a corresponding one of the wiring traces 6a to 6c of the second wiring pattern 6.

The recess 13 of the reflecting frame 12 can be filled with a transparent sealing resin 15 to seal the semiconductor elements 20 to 25 and the bonding wires 14. Therefore, the semiconductor elements 20 to 25 can be protected from the outside environment (for example, moisture, dust, and gas), and the bonding wires 14 can be protected from mechanical stresses such as vibration and shock. When the semiconductor elements 20 to 25 are light emitting elements, the sealing resin 15 can form interfaces with the light emitting surfaces of the semiconductor elements 20 to 25. Therefore, it can have a function of allowing the light from the semiconductor elements 20 to 25 to be efficiently emitted from the light emitting surfaces thereof into the sealing resin 15.

When the semiconductor elements 20 to 25 are light emitting elements, a sealing resin 15 can be produced by mixing a phosphor with a transparent resin. This can achieve a semiconductor device 30 which can emit light of a color different from the color of the semiconductor elements 20 to 25.

Figure 7:
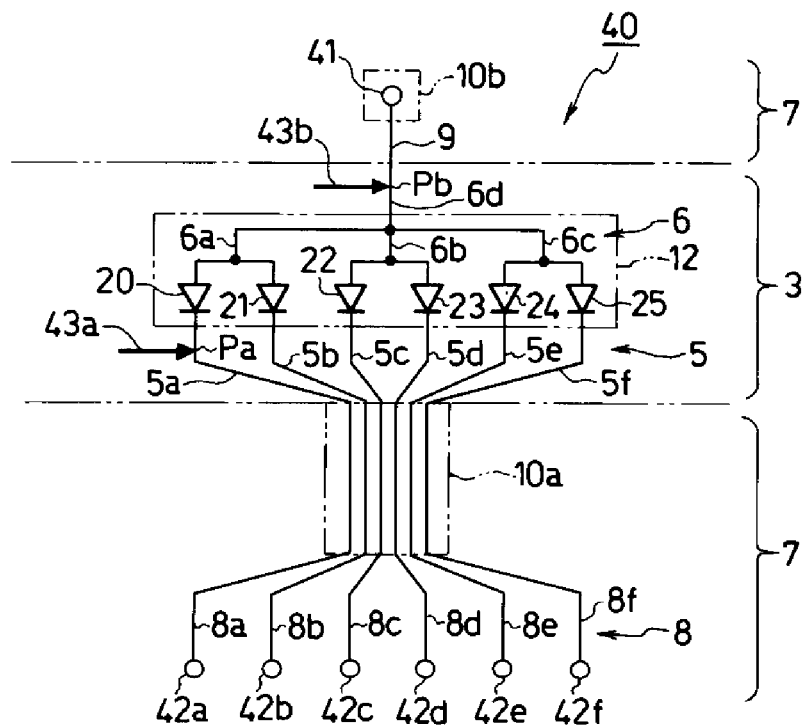
FIG. 7 is an internal connection diagram of the semiconductor device.

FIG. 7 shows internal connections 40 of the semiconductor device 30 having the above configuration. The anodes of the semiconductor elements 20 to 25 can be connected to each other and then connected to a common terminal 41. The cathodes of the semiconductor elements 20 to 25 can be connected to respective independent terminals 42a to 42f.

In the internal connections 40 shown in FIG. 7, the corresponding parts of the semiconductor device 30 are denoted by their reference numerals (see FIGS. 1 and 2 for the semiconductor device).

A description will be given of a test step that can be performed before shipment or a failure analyzing step when a failure occurs. In these cases, for example, a probe 43a of a testing apparatus can be brought into contact with a contact point Pa of one of the wiring traces 5a to 5f of the first wiring trace group 5 that appear on the semiconductor element-mounting surface 3. A probe 43b of the testing apparatus can be brought into contact with a contact point Pb of the second wiring pattern 6 that appears on the semiconductor element-mounting surface 3. In this manner, the characteristics of the individual semiconductor elements 20 to 25 can be measured. In particular, the test can be performed after the semiconductor elements are mounted on the substrate. Accordingly, not only the failure of the semiconductor elements themselves but also the electrical characteristics that tend to have variations after die-bonding or wire-bonding can be tested. Therefore, failures caused by die-bonding or wire-bonding can be found, and a high quality semiconductor device and a high quality semiconductor device module can be provided.

Figure 8:
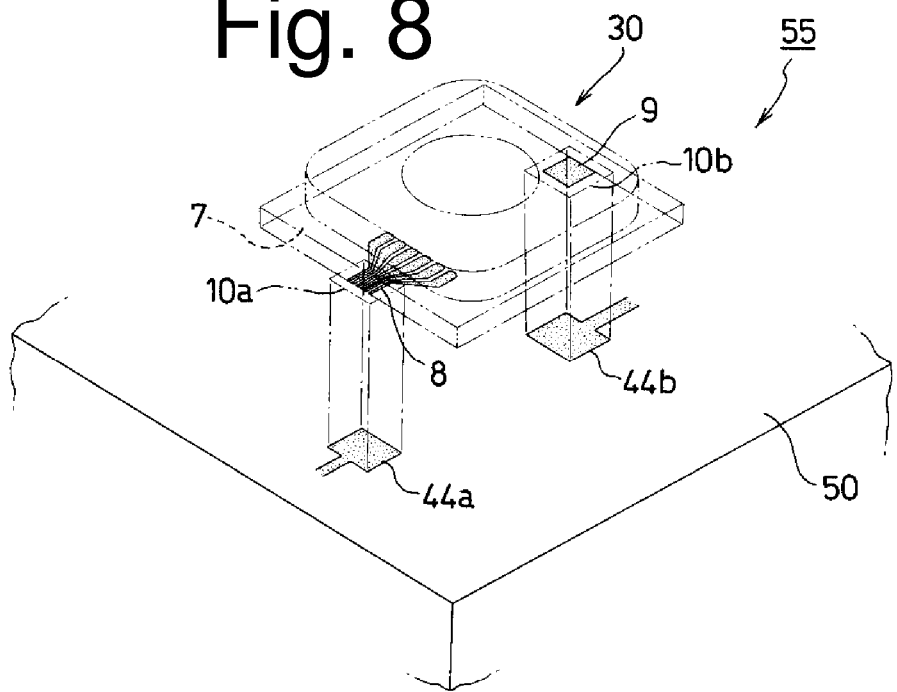
FIG. 8 is a perspective view of a schematic diagram of a semiconductor device module.

Next, with reference to FIGS. 8 to 10, a description will be given of a method for producing a semiconductor device module by mounting a semiconductor device on a semiconductor device-mounting substrate. FIG. 8 is a schematic diagram illustrating the positional relationship between the semiconductor device and the semiconductor device-mounting substrate, FIG. 9 is a schematic diagram illustrating the semiconductor device-mounting substrate and the semiconductor device mounted thereon, and FIG. 10 is a circuit connection diagram when the semiconductor device is mounted on the semiconductor device-mounting substrate.

As shown in FIG. 8, solder-bonding electrode pads 44a and 44b can be formed on the surface of the semiconductor device-mounting substrate 50. More specifically, the solder-bonding electrode pad 44a can be formed in a position corresponding to the solder-bonding area 10a of the third wiring trace group 8 disposed on the solder-bonding side 7 of the semiconductor device 30 to be mounted. The solder-bonding electrode pad 44b can be formed in a position corresponding to the solder-bonding area 10b of the fourth wiring pattern 9 disposed on the solder-bonding side 7. A solder material can be applied to the solder-bonding electrode pads 44a and 44b in advance.

The semiconductor device 30 can be placed on the semiconductor device-mounting substrate 50 with the solder-bonding areas 10a and 10b of the semiconductor device 30 aligned with the solder-bonding electrode pads 44a and 44b of the semiconductor device-mounting substrate 50. Then, in the solder-bonding area 10a, the third wiring trace group 8 of the semiconductor device 30 can be soldered to the solder-bonding electrode pad 44a of the semiconductor device-mounting substrate 50. In the solder-bonding area 10b, the fourth wiring pattern 9 of the semiconductor device 30 can be soldered to the solder-bonding electrode pad 44b of the semiconductor device-mounting substrate 50. In this manner, a semiconductor device module 55 having the semiconductor device 30 mounted on the semiconductor device-mounting substrate 50 can be assembled.

Figure 9:
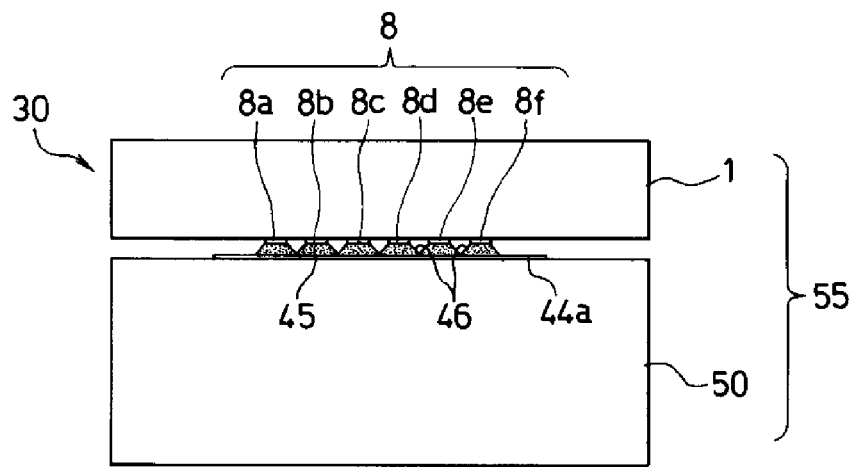
FIG. 9 is a partial enlarged view of the semiconductor device module.
Figure 10:
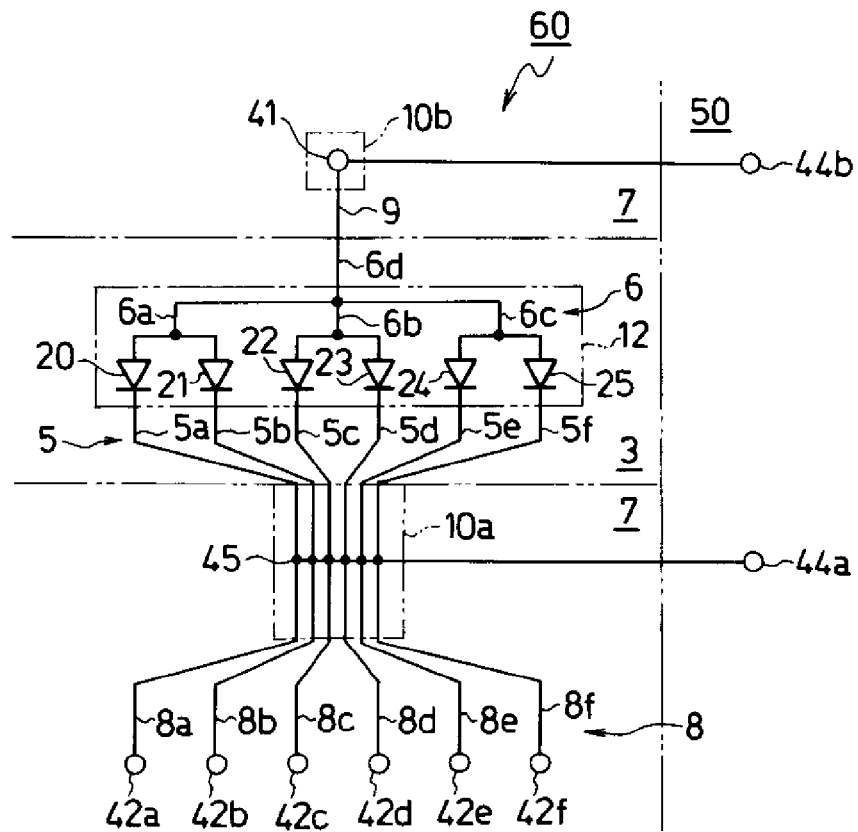
FIG. 10 is a circuit connection diagram of the semiconductor device module.
Figure 11:
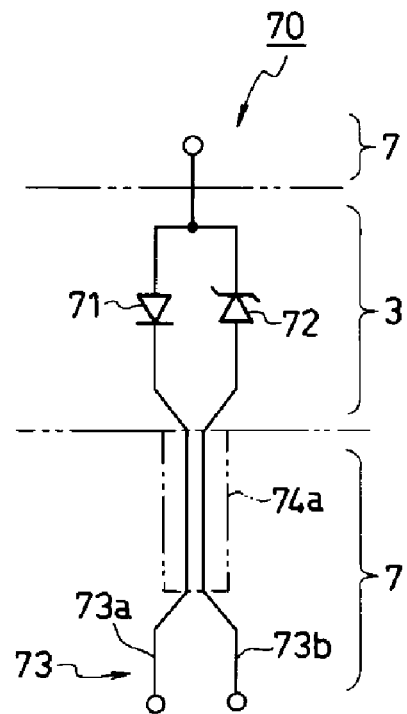
FIG. 11 shows the internal connections of another semiconductor device.

In the assembling process, each of the wiring traces 8a to 8f of the third wiring trace group 8 of the substrate 1 of the semiconductor device 30 can be mechanically and electrically connected to the solder-bonding electrode pad 44a of the semiconductor device-mounting substrate 50 through solder 45, as shown in FIG. 9. In addition, all the wiring traces 8a to 8f can be integrated through solder fillets 46 and therefore electrically connected.

To ensure the integration of the wiring traces 8a to 8f through the solder fillets 46 during solder bonding, the wiring traces 8a to 8f can be formed such that, in the solder-bonding area 10a, the width and the spacing are smaller than those in the other area. In this manner, also the areas of the solder-bonding electrode pads 44a and 44b of the semiconductor device-mounting substrate 50 can be reduced. The displacement of a mask used when the solder is applied can be reduced within the range where the mounting strength of solder bonding can be maintained.

FIG. 10 shows the circuit connections 60 of the semiconductor device module 55 configured as above. The anodes of the semiconductor elements 20 to 25 can be connected to each other and then connected to the solder-bonding electrode pad 44b of the semiconductor device-mounting substrate 50 through the common terminal 41. The cathodes of the semiconductor elements 20 to 25 can be integrated in the solder-bonding area 10a through the solder 45 and then connected to the solder-bonding electrode pad 44a of the semiconductor device-mounting substrate 50.

In the circuit connections 60 shown in FIG. 10, the corresponding parts of the semiconductor device module 55 are denoted by their reference numerals (see FIGS. 1, 2, and 8 for the semiconductor device module).

As shown in the circuit connections 60 in FIG. 10, in the semiconductor device module 55, the circuit connections between the solder-bonding electrode pads 44a and 44b of the semiconductor device-mounting substrate 50 can form a parallel circuit of the semiconductor elements 20 to 25. Therefore, when a predetermined voltage is applied between the solder-bonding electrode pads 44a and 44b, all the semiconductor elements 20 to 25 can be driven.

In the above description, the semiconductor device includes six semiconductor elements, and all the semiconductor elements have the same function (for example, all the semiconductor elements are semiconductor light emitting elements having a function of emitting light). However, a semiconductor device can include two elements having different functions. More specifically, for example, as shown in internal connections 70 in FIG. 11, a semiconductor device can include a semiconductor light emitting element 71 such as an LED element that does not resist external stress and a Zener diode 72 that serves as a protection element for the semiconductor light emitting element 71. In other words, the internal connections can be configured such that opposite bias voltages are applied to semiconductor elements having different functions (such as a semiconductor light emitting element, a semiconductor light receiving element, and a protection element).

Figure 12:
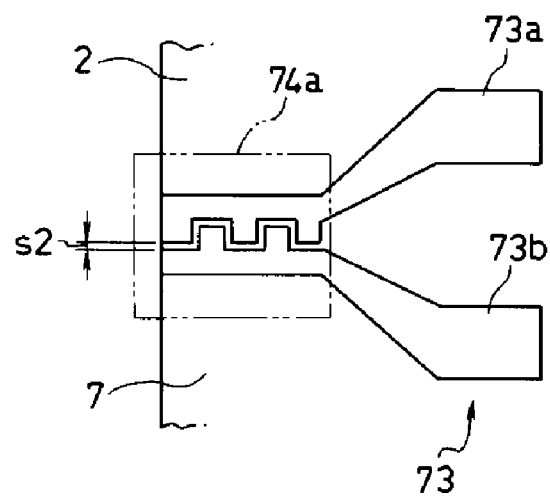
FIG. 12 is a partial enlarged view of one surface of the substrate of another semiconductor device.

This semiconductor device can include wiring traces 73a and 73b constituting a third wiring trace group 73 disposed on the solder-bonding side 7 of an insulating substrate 2. As shown in FIG. 12, in a solder-bonding area 74a, the wiring traces 73a and 73b can be formed to have key-like shapes facing each other. The spacing s2 between the wiring traces 73a and 73b can be 0.08 mm. By forming the wiring traces 73a and 73b such that the shapes in the solder-bonding area 74a and the spacing therebetween are as described above, the semiconductor device can be reliably mounted on the semiconductor device-mounting substrate by solder bonding.

Figure 13:
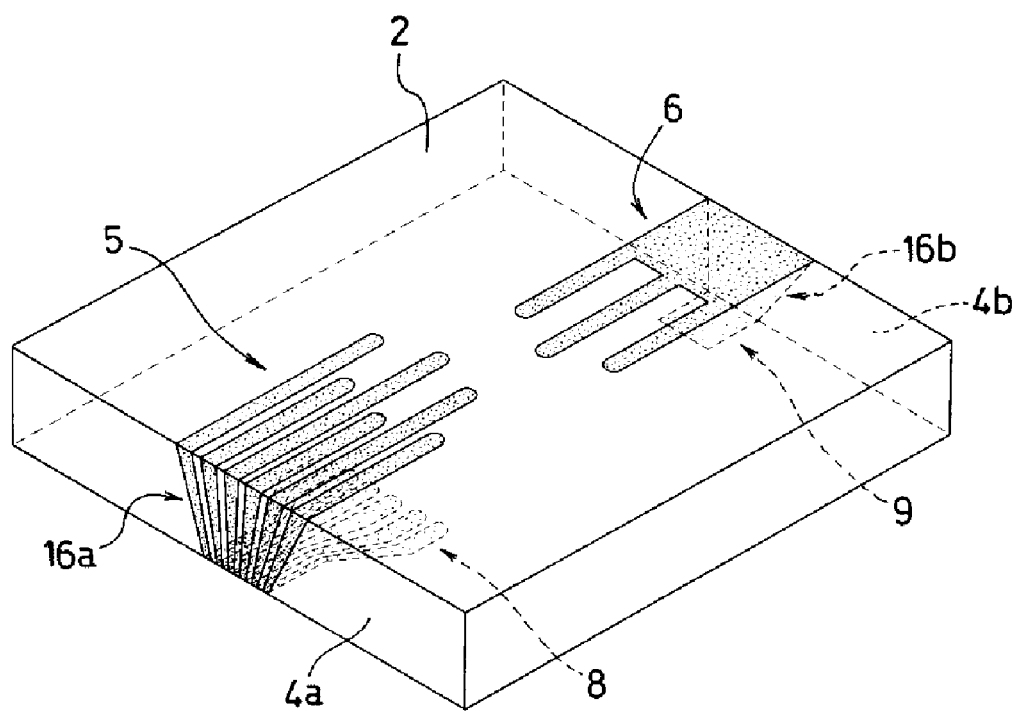
FIG. 13 is a perspective view of a schematic diagram of another substrate of a semiconductor device.

It should be noted that, as shown in FIG. 13, a semiconductor device can be configured such that the connection between the first wiring trace group 5 and the third wiring trace group 8 formed with the insulating substrate 2 interposed therebetween and the connection between the second wiring pattern 6 and the fourth wiring pattern 9 can be established through wiring patterns 16a and 16b formed on the sides 4a and 4b of the insulating substrate 2.

To mount the semiconductor device on the semiconductor device-mounting substrate, the solder-bonding areas of the semiconductor device that are soldered to the solder-bonding electrode pads formed on the semiconductor device-mounting substrate can be formed on the side of the substrate of the semiconductor device that is opposite to the side on which the semiconductor elements are mounted. However, the presently disclosed subject matter is not limited thereto, and solder-bonding areas can be formed on the surface on which the semiconductor elements are mounted. In such a case, the semiconductor device can be mounted so as to abut on the rear side of the semiconductor device-mounting substrate. For example, the semiconductor module is configured such that a window hole (opening) is formed in the semiconductor device-mounting substrate and the semiconductor elements of the semiconductor device disposed on the rear side are located within the window opening.

In addition to the ceramic substrate described above, a glass epoxy substrate, a resin-molded substrate, or the like can be used as the insulating substrate of the semiconductor device. The wiring patterns can be formed by printing and also by metal plating.

As has been described in detail, in various aspects of the presently disclosed subject matter, the connection structure of the plurality of semiconductor elements of the semiconductor device before mounting can be different from the connection structure after the semiconductor device is mounted on the semiconductor device-mounting substrate by solder bonding to form the semiconductor module.

More specifically, before the semiconductor device is mounted, the plurality of semiconductor elements can be connected so as to be electrically independent of each other. Therefore, to test the semiconductor device during production or to analyze a failure when the failure occurs, the electrical and optical characteristics of the individual semiconductor elements can be tested or analyzed by energizing the individual semiconductor elements.

The semiconductor module can have a connection structure in which the plurality of semiconductor elements can be connected to form a parallel circuit. Therefore, all the semiconductor elements can be driven by applying a voltage between the pair of solder-bonding electrode pads formed on the semiconductor device-mounting substrate.

As described above, the electrical and optical characteristics of the individual semiconductor elements of the semiconductor device can be easily tested. Moreover, if a failure occurs in some of the semiconductor elements of the semiconductor device or in the attachment condition of the semiconductor elements, the failure of the faulty semiconductor elements can be easily analyzed, and measures can be easily taken based on the analysis results.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor device comprising:
   a substrate;
   a plurality of semiconductor elements mounted on the substrate and each of the plurality of semiconductor elements including a first potential applied electrode and a second potential applied electrode;
   a first wiring pattern formed on the substrate and electrically connected to the first potential applied electrodes of the plurality of semiconductor elements; and
   a second wiring pattern formed on the substrate and electrically connected to the second potential applied electrodes of the plurality of semiconductor elements,
   wherein the semiconductor device is configured to be mounted on a semiconductor device-mounting substrate with the plurality of semiconductor elements connected in parallel to define a semiconductor device module,
   the first wiring pattern includes a wiring trace group including a plurality of electrically independent wiring traces connected to the first potential applied electrodes of the plurality of semiconductor elements, and
   the wiring trace group includes a bonding area that serves as a bonding portion to be bonded to the semiconductor device-mounting substrate, the electrically independent wiring traces being electrically connected to each other in the bonding area when the semiconductor device is mounted on the semiconductor device-mounting substrate.

2. The semiconductor device module according to claim 1, wherein the semiconductor device is configured to be mounted on a semiconductor device-mounting substrate and includes a solder material located adjacent the semiconductor device for connection to the semiconductor device-mounting substrate.

3. The semiconductor device according to claim 2, wherein, in the bonding area, a spacing between adjacent ones of the electrically independent wiring traces is smaller than a spread width of the solder material spread during bonding.

4. The semiconductor device according to claim 3, wherein, in the bonding area, a spacing between adjacent ones of the electrically independent wiring traces is at most 0.1 mm.

5. The semiconductor device according to claim 2, wherein, in the bonding area, a spacing between adjacent ones of the electrically independent wiring traces is at most 0.1 mm.

6. The semiconductor device according to claim 1, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

7. The semiconductor device according to claim 2, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

8. The semiconductor device according to claim 3, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

9. The semiconductor device according to claim 4, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

10. The semiconductor device according to claim 5, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

11. A semiconductor device module comprising:
    a semiconductor device-mounting substrate including a circuit pattern formed thereon; and
    a semiconductor device mounted on the semiconductor device-mounting substrate, the semiconductor device including:
      a substrate,
      a plurality of semiconductor elements mounted on the substrate and each of the plurality of semiconductor elements including a first potential applied electrode and a second potential applied electrode, a first wiring pattern formed on the substrate and electrically connected to the first potential applied electrodes of the plurality of semiconductor elements, and a second wiring pattern formed on the substrate and electrically connected to the second potential applied electrodes of the plurality of semiconductor elements, wherein the first wiring pattern includes a wiring trace group including a plurality of separate wiring traces connected to the first potential applied electrodes of the plurality of semiconductor elements, and wherein the wiring trace group includes a bonding area bonded to the semiconductor device-mounting substrate, the separate wiring traces of the first wiring pattern being electrically connected to each other in the bonding area.

12. The semiconductor device module according to claim 11, wherein the semiconductor device is mounted on the semiconductor device-mounting substrate with a solder material.

13. The semiconductor device module according to claim 12, wherein, in the bonding area, a spacing between adjacent ones of the electrically independent wiring traces is smaller than a spread width of the solder material spread during bonding.

14. The semiconductor device module according to claim 12, wherein, in the bonding area, a spacing between adjacent ones of the electrically independent wiring traces is at most 0.1 mm.

15. The semiconductor device module according to claim 13, wherein, in the bonding area, a spacing between adjacent ones of the electrically independent wiring traces is at most 0.1 mm.

16. The semiconductor device module according to claim 13, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

17. The semiconductor device module according to claim 14, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

18. The semiconductor device module according to claim 15, wherein at least adjacent two of the electrically independent wiring traces each have protruding portions, the protruding portions of each one of the at least adjacent two of the electrically independent wiring traces being formed to protrude toward the other one of the at least adjacent two of the electrically independent wiring traces, the protruding portions being disposed in a staggered manner.

19. The semiconductor device module according to claim 11, wherein the plurality of semiconductor elements are connected in parallel.

20. A method for manufacturing a semiconductor device module comprising:

providing a semiconductor device-mounting substrate and a semiconductor device wherein:
the semiconductor device-mounting substrate includes a circuit pattern formed thereon; and
the semiconductor device includes:
a substrate;
a plurality of semiconductor elements mounted on the substrate and each of plurality of semiconductor elements includes a first potential applied electrode and a second potential applied electrode;
a first wiring pattern formed on the substrate and electrically connected to the first potential applied electrodes of the plurality of semiconductor elements; and
a second wiring pattern formed on the substrate and electrically connected to the second potential applied electrodes of the plurality of semiconductor elements;

preparing the semiconductor device in which the first wiring pattern includes a wiring trace group including a plurality of electrically independent wiring traces connected to the first potential applied electrodes of the plurality of semiconductor elements;

applying a solder material to a predetermined position on the circuit pattern; and mounting the semiconductor device on the semiconductor device-mounting substrate such that the plurality of electrically independent wiring traces are electrically connected to each other in a part of the wiring trace group through the solder material.

* * * * *